United States Patent
Kuroda et al.

[11] Patent Number: 5,891,298
[45] Date of Patent: Apr. 6, 1999

[54] METHOD AND APPARATUS FOR PEELING PROTECTIVE ADHESIVE TAPE FROM SEMICONDUCTOR WAFER

[75] Inventors: Shigeji Kuroda; Takao Matsushita; Saburo Miyamoto, all of Ibaraki, Japan

[73] Assignee: Nitto Denko Corporation, Osaka, Japan

[21] Appl. No.: 973,859
[22] PCT Filed: Aug. 28, 1996
[86] PCT No.: PCT/JP96/02476
 § 371 Date: Dec. 30, 1997
 § 102(e) Date: Dec. 30, 1997
[87] PCT Pub. No.: WO97/08745
 PCT Pub. Date: Mar. 6, 1997

[30] Foreign Application Priority Data

Aug. 31, 1995 [JP] Japan ................................. 7-248511

[51] Int. Cl.⁶ .................................................. B32B 35/00
[52] U.S. Cl. .......................... 156/344; 156/241; 156/247; 156/584; 156/289; 438/459
[58] Field of Search ................................. 156/241, 247, 156/299, 344, 584, 289; 29/239, 426.1, 426.3, 426.5; 226/96; 271/900; 438/458, 459

[56] References Cited

U.S. PATENT DOCUMENTS

| | | | |
|---|---|---|---|
| 4,285,759 | 8/1981 | Allen et al. | |
| 4,631,103 | 12/1986 | Ametani | 156/344 X |
| 4,775,438 | 10/1988 | Funakoshi et al. | 156/344 X |
| 5,006,190 | 4/1991 | Earle | 156/344 X |
| 5,009,735 | 4/1991 | Ametani et al. | 156/344 X |
| 5,254,201 | 10/1993 | Konda et al. | |
| 5,310,442 | 5/1994 | Ametani | 156/344 X |
| 5,705,016 | 1/1998 | Senoo et al. | 156/289 |

FOREIGN PATENT DOCUMENTS

| | | |
|---|---|---|
| 318 806 A2 | 6/1989 | European Pat. Off. |
| 5-63077 | 3/1993 | Japan |

*Primary Examiner*—Mark A. Osele
*Attorney, Agent, or Firm*—Nikaido, Marmelstein, Murray & Oram LLP

[57] ABSTRACT

A method and apparatus for peeling protective adhesive tape 3 from work having the protective adhesive tape 3 applied to a surface of a semiconductor wafer W supported in a ring-shaped frame F by means of a supporting adhesive tape 1. Thin plates 4 with non-adhesive upper surfaces are applied to the supporting adhesive tape 1 adjacent a peel starting end 3a and a peel finishing end 3b of protective adhesive tape 3, respectively, to form regions for avoiding contact between a peeling tape 5 wound around an applying roller 8 and the like and the supporting adhesive tape 1. Subsequently, the peeling tape 5 is applied to the protective adhesive tape 3 at the peel starting end 3a with the applying roller 8, and a group of rollers 6–8 is moved horizontally on the work A to peel the peeling tape 5 and protective adhesive tape 3 together from the surface of semiconductor wafer W.

15 Claims, 18 Drawing Sheets ns for
peeling a protective adhesive tape applied to a surface of a
semiconductor wafer supported in a ring-shaped frame by
means of a supporting adhesive tape and having circuit
patterns such as of IC elements formed thereon.

METHOD AND APPARATUS FOR PEELING PROTECTIVE ADHESIVE TAPE FROM SEMICONDUCTOR WAFER

TECHNICAL FIELD

This invention relates to a method and apparatus for peeling a protective adhesive tape applied to a surface of a semiconductor wafer supported in a ring-shaped frame by means of a supporting adhesive tape and having circuit patterns such as of IC elements formed thereon.

BACKGROUND ART

As processing steps executed after circuit patterns are formed on the surface of a semiconductor wafer, those shown in Japanese Patent Publication (Unexamined) H5-63077, for example, have been proposed heretofore.

The processing steps executed after the circuit patterns are formed include a back grinding step for cutting and grinding the back of the wafer to a required thickness, a dicing step for cutting and dividing the wafer into individual elements, and so on. Since the wafer undergoes mechanical stress in each of these steps, a separate step is provided for applying adhesive tape to the surface of the wafer to protect the circuit patterns on the surface of the wafer and fix the wafer in position.

The flow of these steps is approximately as follows. First, in the back grinding step, (1) a protective adhesive tape is applied to the surface of the wafer on which circuit patterns are formed. (2) After the wafer surface to which the protective adhesive tape has been applied is supported by a suction member and the wafer is fixed in position, its back is cut and ground. With the protective adhesive tape applied to the wafer surface, the next, adhesive tape applying and peeling steps are executed. (3) The protective adhesive tape on the surface of the wafer is peeled after a supporting adhesive tape having strong adhesion is applied to the back of the wafer and the wafer is mounted in a ring-shaped frame by means of this supporting adhesive tape. In the next dicing step, (4) the wafer is cut and divided into individual elements by a diamond cutter rotating at high speed.

Through the above flow of steps, the process after the circuit patterns are formed on the semiconductor wafer surface is performed. Details of the above step (3) for peeling the protective adhesive tape from the wafer surface will be described with reference FIGS. 25 through 27. First, as shown in FIG. 25, a wafer W mounted in a ring-shaped frame F by means of supporting adhesive tape 1 is suction-supported on a suction table 2. A draw roller 6 and a pinch roller 7 on which a peeling tape 5 drawn from a supply source not shown is wound, and an applying roller 8, are arranged slightly above a peel starting end 3a of protective adhesive tape 3 applied to the surface of wafer W. Next, as shown in FIG. 26, the applying roller 8 is lowered and biased to said peel starting end 3a to bond the peeling tape 5 and protective adhesive tape 3 together. Then, as shown in FIG. 27, the pinch roller 7 is lowered to the draw roller 6, and the three rollers 6, 7 and 8 are moved in the direction of a peel finishing end 3b ( afterward in FIG. 27). At this time, the applying roller 8 moves while pressing the peeling tape 5 on the protective adhesive tape 3, and the draw roller 6 peels the protective adhesive tape 3 by means of the peeling tape 5.

However, the above step of peeling the protective adhesive tape has the problem set out below. That is, when the applying roller 8 is lowered and biased to the peel starting end 3a to bond the peeling tape 5 and protective adhesive tape 3 together, since, as is well-known, the wafer W is very thin, with the thickness approximately 110–450 μm, as shown in FIG. 28, for example, the supporting adhesive tape 1 exposed adjacent the peel starting end 3a of protective adhesive tape 3 and the peeling tape 5 lowered and biased by the applying roller 8 from above the peel starting end 3a have adhesive surfaces thereof stick to each other. When the three rollers 6, 7 and 8 are moved in this state to continue the peeling operation, the wafer W undergoes bending stress and the wafer W could crack.

To avoid the above inconvenience, as shown in FIG. 29, for example, the applying roller 8 may be lowered and biased slightly inwardly of the peel starting end 3a of protective adhesive tape 3 in the direction of the center of protective adhesive tape 3 to bond the peeling tape 5 and protective adhesive tape 3 together. Then, the peeling tape 5 is not applied to the peel starting end 3a of protective adhesive tape 3. The protective adhesive tape 3 cannot be peeled smoothly when the three rollers 6, 7 and 8 are moved in the direction of the peel finishing end 3b (leftward in FIG. 29).

This invention has been made having regard to the state of the art noted above, and its object is to provide a method and apparatus for peeling a protective adhesive tape from a semiconductor wafer reliably, without a peeling tape and a supporting adhesive tape applied to the back of the wafer sticking to each other.

DISCLOSURE OF THE INVENTION

This invention provides a method and apparatus for peeling a protective adhesive tape from work having the protective adhesive tape applied to a surface of a semiconductor wafer supported in a ring-shaped frame by means of a supporting adhesive tape, which provide a region for avoiding contact between the supporting adhesive tape at least adjacent a peel starting end of the protective adhesive tape and a peeling tape wound around rollers when applying the peeling tape to the protective adhesive tape with the rollers and horizontally moving the work and the rollers relative to each other to peel the peeling tape and the protective adhesive tape together from the surface of the semiconductor wafer. As a result, the peeling tape and supporting adhesive tape never stick to each other, whereby the protective adhesive tape may be peeled smoothly with no excessive bending stress acting on the wafer. Where a region is provided for avoiding contact between the supporting adhesive tape and peeling tape adjacent the peel finishing end of the protective adhesive tape, the two tapes never stick to each other also when the process of peeling the protective adhesive tape is completed.

The term "non-adhesive" used in this invention refers to a degree not having strong affinity to the adhesive on the peeling tape or supporting adhesive tape, and, in short, a degree for allowing the adhesive tape to be peeled off without applying a strong force when the peeling tape or supporting adhesive tape is pasted.

The following techniques are disclosed for applying the region for avoiding contact between the supporting adhesive tape adjacent the peel starting end of the protective adhesive tape, and the peeling tape wound around the rollers.

The first is a technique of avoiding contact between the peeling tape and supporting adhesive tape by applying a thin plate member with a non-adhesive upper surface to the supporting adhesive tape.

The second is a technique of avoiding contact between the peeling tape and supporting adhesive tape by displacing an elastic member with non-adhesive opposite surfaces from a retracted position to a position adjacent and above said supporting adhesive tape.

The third is a technique of avoiding contact between the peeling tape and supporting adhesive tape by inclining the supporting adhesive tape downward toward the frame by displacing the ring-shaped frame and the semiconductor wafer vertically relative to each other.

The first technique and third technique, or the second technique and third technique may be combined for implementation.

Further, this invention discloses a method and apparatus which use an ultraviolet curable adhesive tape as the protective adhesive tape, and irradiates the protective adhesive tape with ultraviolet rays before peeling the protective adhesive tape of the semiconductor wafer. With this arrangement, the adhesive on the protective adhesive tape cures to weaken the adhesion between the protective adhesive tape and the surface of the semiconductor wafer, thereby allowing the protective adhesive tape to be peeled easily.

This invention also discloses an apparatus for peeling the protective adhesive tape of the semiconductor wafer, including a wafer mounting device for supporting the semiconductor wafer having the protective adhesive tape is applied to the surface thereof, in the ring-shaped frame by means of the supporting adhesive tape.

BEST MODE FOR CARRYING OUT THE INVENTION

Figure 1:
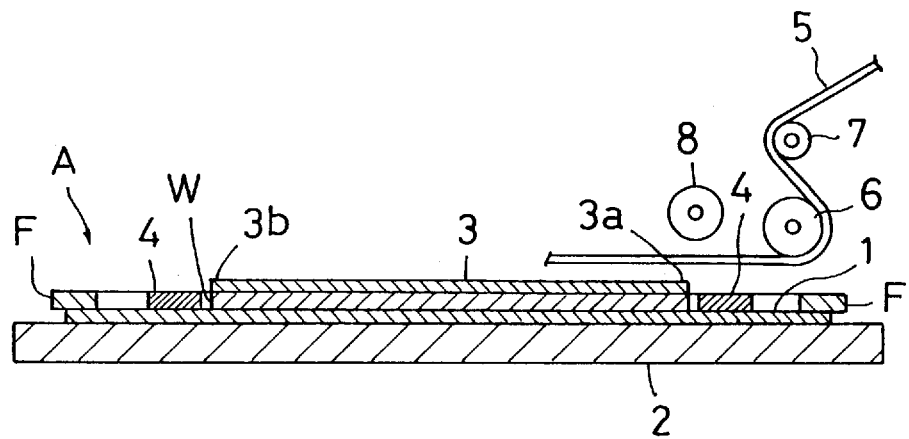
FIG. 1 is an explanatory view of a method of peeling a protective adhesive tape in a first embodiment of this invention.

Embodiments of this invention will be described hereinafter with reference to the drawings. In the drawings, the thicknesses of adhesive tapes and a semiconductor wafer are exaggerated for expediency of illustration.

<Method in the First Embodiment of This Invention>

Figure 2:
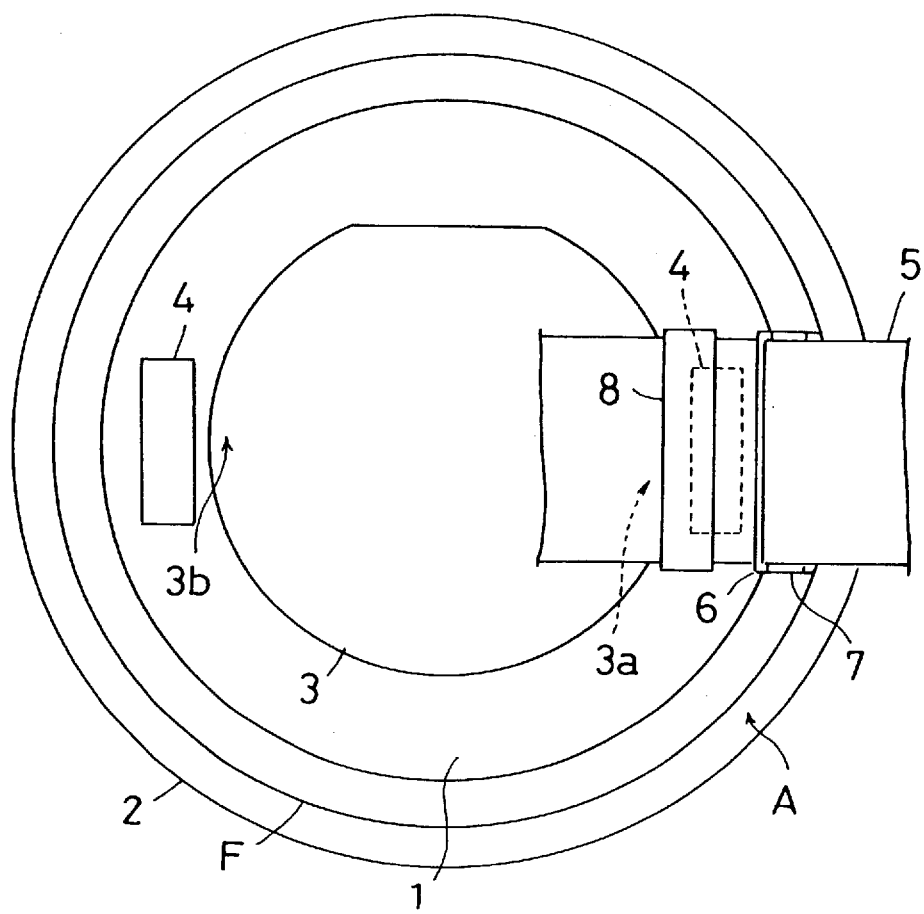
FIG. 2 is a plan view of the first embodiment shown in FIG. 1.
Figure 3:
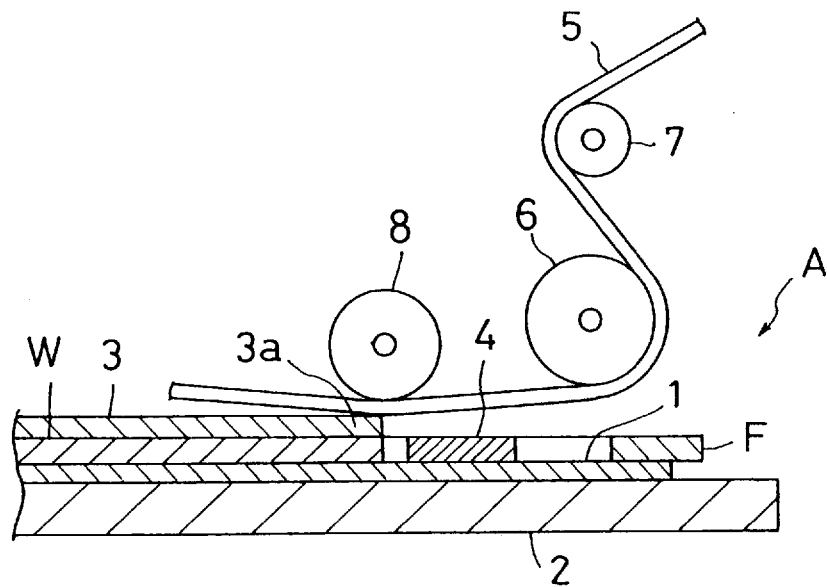
FIG. 3 is an enlarged explanatory view of a principal portion illustrating the method of peeling the protective adhesive tape.
Figure 4:
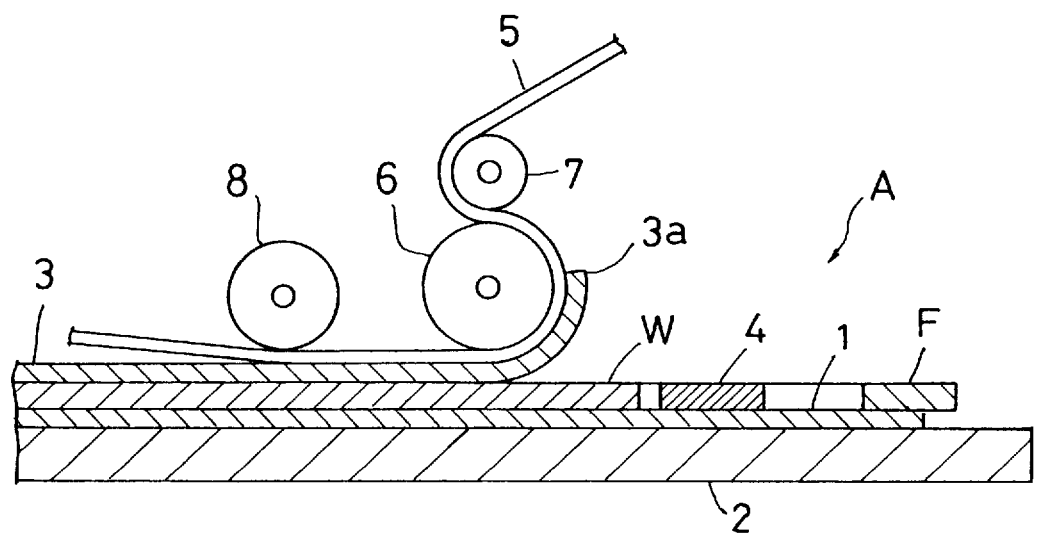
FIG. 4 is an enlarged explanatory view of the principal portion illustrating the method of peeling the protective adhesive tape.

FIG. 1 is an explanatory view of a method of peeling a protective adhesive tape in a first embodiment of this invention, FIG. 2 is a plan view of the first embodiment, and FIG. 3 and FIG. 4 are enlarged explanatory views of a principal portion illustrating the method of peeling the protective adhesive tape.

First, as shown in FIG. 1 and FIG. 2, a semiconductor wafer (hereinafter also simply called the wafer) W mounted in a ring-shaped frame (hereinafter also simply called the frame) F by means of a supporting adhesive tape 1 acts as work A and is suction-supported on a suction table 2. Thin plates 4 having upper surfaces thereof coated with a non-adhesive material (e.g. fluororesin, polyethylene or the like) are applied to the supporting adhesive tape 1 exposed between a peel starting end 3a and a peel finishing end 3b of a protective adhesive tape 3 applied to the surface of wafer W and the frame F present outwardly thereof. These thin plates 4 may be formed of the non-adhesive material per se, such as fluororesin, polyethylene or the like. It is also possible to use thin stainless steel plates or the like which do not exhibit strong adhesion to adhesive tape. These thin plates 4 preferably have a thickness approximately corresponding to or thinner than the thickness of wafer W, in order to press a peeling tape 5 described later to the peel starting end 3a of protective adhesive tape 3. A draw roller 6 and a pinch roller 7 on which the peeling tape 5 drawn from a supply source not shown is wound, and an applying roller 8, are arranged slightly above the peel starting end 3*a* of protective adhesive tape 3 applied to the surface of wafer W.

Next, as shown in FIG. 3, the applying roller 8 is lowered and biased to the peel starting end 3*a* of protective adhesive tape 3 to bond the peeling tape 5 and protective adhesive tape 3 together. At this time, even if the peeling tape 5 inadvertently advances onto the supporting adhesive tape 1 exposed between the peel starting end 3*a* of protective adhesive tape 3 and the frame F present outwardly thereof, the peeling tape 5 and supporting adhesive tape 1 never stick to each other since the upper surface of supporting adhesive tape 1 is guarded by the non-adhesive thin plates 4.

Then, as shown in FIG. 4, the pinch roller 7 is lowered to the draw roller 6, and the three rollers 6, 7 and 8 are moved in the direction of the peel finishing end 3*b* (leftward in FIG. 4). At this time, the applying roller 8 moves while pressing the peeling tape 5 on the protective adhesive tape 3, and the draw roller 6 winds and peels the protective adhesive tape 3 integrated with the peeling tape 5. Since the peeling tape 5 and supporting adhesive tape 1 do not stick to each other as noted above, no inconvenience such as cracking of wafer W occurs. The peeling process may be carried out smoothly, without the peeling tape 5 and supporting adhesive tape 1 sticking to each other when the peeling process is completed since the thin plate 4 is applied also to the supporting adhesive tape 1 adjacent the peel finishing end 3*b* of protective adhesive tape 3.

This embodiment may be implemented in the modified form set out hereunder.

In this embodiment, the upper surfaces of thin plates 4 are coated with a non-adhesive material such as fluororesin, polyethylene or the like. The thin plates 4 may have numerous pores formed therein, or the upper surfaces of thin plates 4 may be formed rugged with sawteeth to diminish areas of contact with the peeling tape 5, thereby lowering adhesion.

<Method in the Second Embodiment of This Invention>

Figure 5:
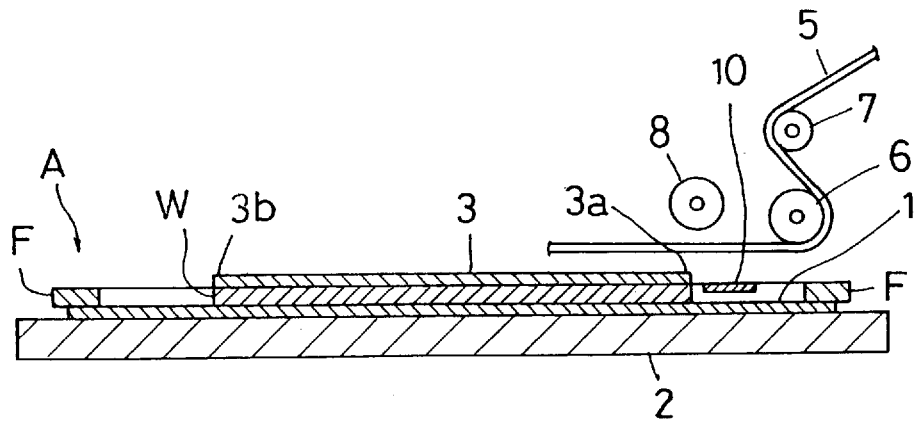
FIG. 5 is an explanatory view of a method of peeling a protective adhesive tape in a second embodiment.
Figure 6:
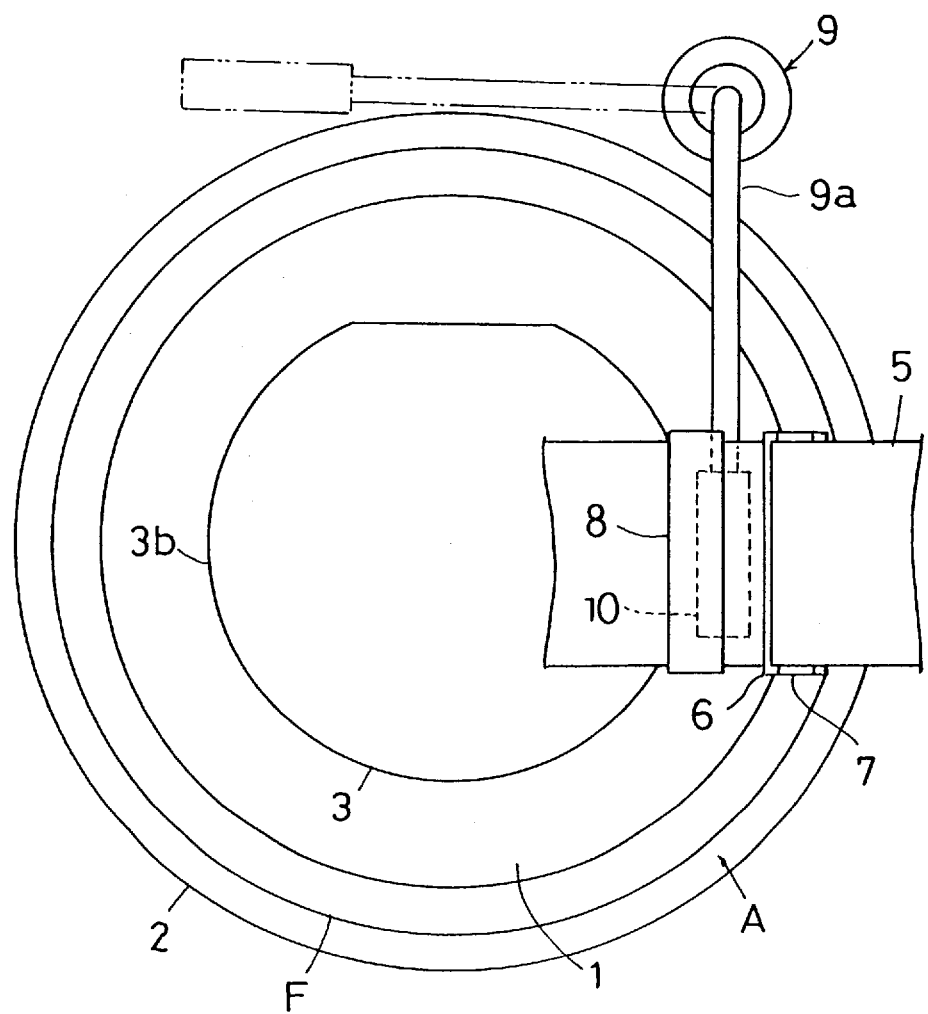
FIG. 6 is a plan view of the second embodiment shown in FIG. 5.
Figure 7:
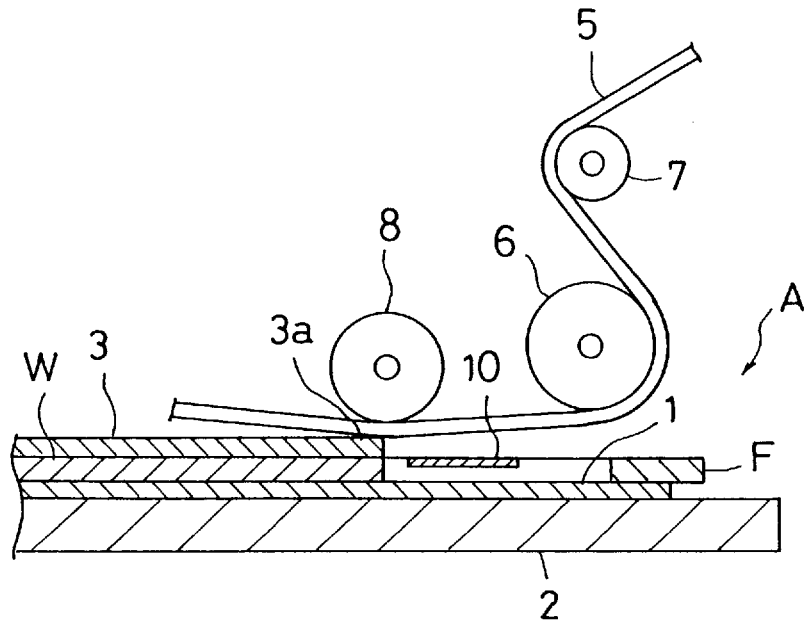
FIG. 7 is an enlarged explanatory view of a principal portion illustrating the method of peeling the protective adhesive tape.
Figure 8:
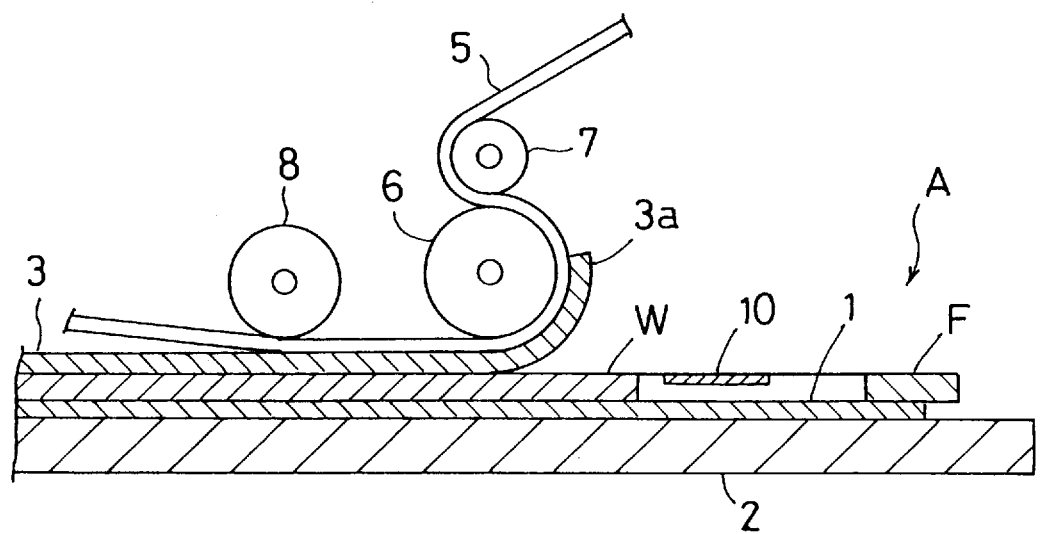
FIG. 8 is an enlarged explanatory view of a principal portion illustrating the method of peeling the protective adhesive tape.

FIG. 5 is an explanatory view of a method of peeling a protective adhesive tape in a second embodiment of this invention, FIG. 6 is a plan view of the second embodiment, and FIG. 7 and FIG. 8 are enlarged explanatory views of a principal portion illustrating the method of peeling the protective adhesive tape.

First, as shown in FIG. 5 and FIG. 6, work A is suction-supported on a suction table 2 as in the foregoing first embodiment. A robot arm 9 is disposed adjacent this suction table 2, and a plate spring 10 having opposite surfaces coated with a non-adhesive material (e.g. fluororesin, polyethylene or the like) is attached to a distal end of a vertically movable and pivotable arm 9*a*. The arm 9*a* is vertically moved and swung to place the plate spring 10 adjacent and above a supporting adhesive tape 1 exposed between a peel starting end 3*a* of a protective adhesive tape 3 applied to the surface of wafer W and the frame F present outwardly thereof (i.e. in a position shown in a broken line in FIG. 6). A group of rollers 6, 7 and 8 on which a peeling tape 5 drawn from a supply source not shown is wound is arranged slightly above the peel starting end 3*a* of protective adhesive tape 3 applied to the surface of wafer W.

Next, as shown in FIG. 7, the applying roller 8 is lowered and biased to the peel starting end 3*a* to bond the peeling tape 5 and protective adhesive tape 3 together. At this time, even if the peeling tape 5 advances onto the supporting adhesive tape 1 exposed between the peel starting end 3*a* of protective adhesive tape 3 and the frame F present outwardly thereof, the peeling tape 5 and supporting adhesive tape 1 never stick to each other since the supporting adhesive tape 1 is guarded by the plate spring 10 having the non-adhesive opposite surfaces and disposed adjacent and above the supporting adhesive tape 1. Even if the plate spring 10 is deformed by the descent and biasing of the applying roller 8 to contact the upper surface of supporting adhesive tape 1 right thereunder, the plate spring 10 oscillates and returns by elasticity to maintain a constant posture at all times.

Then, as shown in FIG. 8, while the three rollers 6, 7 and 8 are moved in the direction of the peel finishing end 3*b* (leftward in FIG. 8) as in the foregoing first embodiment, the protective adhesive tape 3 integrated with the peeling tape 5 is wound and peeled. Since the peeling tape 5 and supporting adhesive tape 1 do not stick to each other as noted above, no inconvenience such as cracking of wafer W occurs.

When the operation to peel the protective adhesive tape 3 is completed, the plate spring 10 is once retracted from the position adjacent and above the supporting adhesive tape 1 to an outward position (i.e. the position shown in a chain line in FIG. 6). The work A having undergone the peeling process is removed from the suction table 2 and forwarded to a next step. The suction table 2 stands by until next work is delivered thereto.

This embodiment may be implemented in the modified forms set out hereunder.

(1) In this embodiment, the opposite surfaces of plate spring 10 are coated with a non-adhesive material such as fluororesin, polyethylene or the like. The plate spring 10 itself may be formed of the non-adhesive material. The plate spring 10 may have numerous pores formed therein, or the opposite surfaces of plate spring 10 may be formed rugged with sawteeth to diminish areas of contact with the supporting adhesive tape 1 or peeling tape 5, thereby lowering adhesion.

(2) In the embodiment of the above method, the plate spring 10 is attached to the robot arm 9 to be movable from the retracted position to the position adjacent and above the supporting adhesive tape 1. A different way is also possible.

(3) In the embodiment of the above method, the plate spring 10 is placed in the position adjacent and above the supporting adhesive tape 1 exposed between the peel starting end 3*a* and the frame F present outwardly thereof A plate spring may be placed also in a position adjacent and above the supporting adhesive tape 1 adjacent the peel finishing end 3*b* of protective adhesive tape 3. Then, the peeling process may be carried out reliably without the peeling tape 5 and supporting adhesive tape 1 sticking to each other when the peeling process is competed.

<Method in the Third Embodiment of This Invention>

Figure 9:
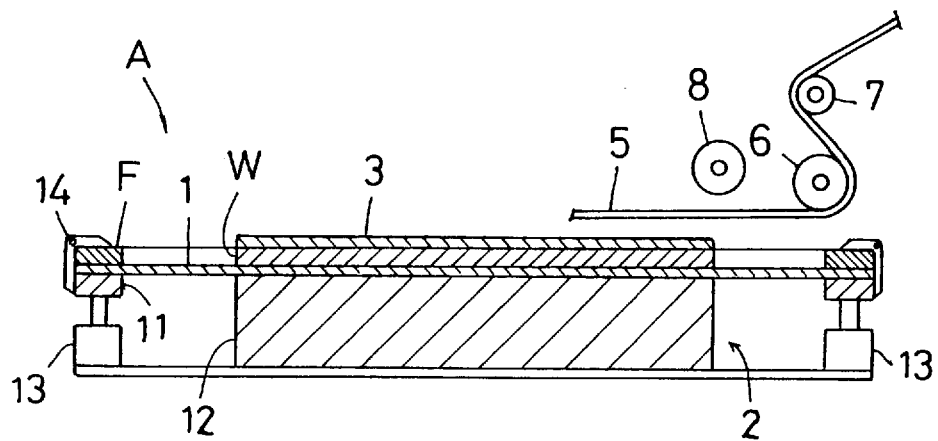
FIG. 9 is an explanatory view of a method of peeling a protective adhesive tape in a third embodiment.
Figure 10:
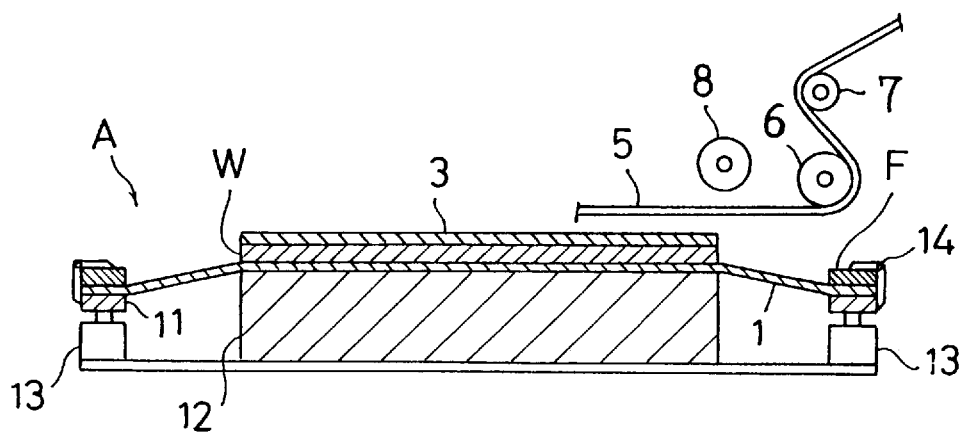
FIG. 10 is a front view of a portion around a suction table with a frame raising and lowering section in operation.
Figure 11:
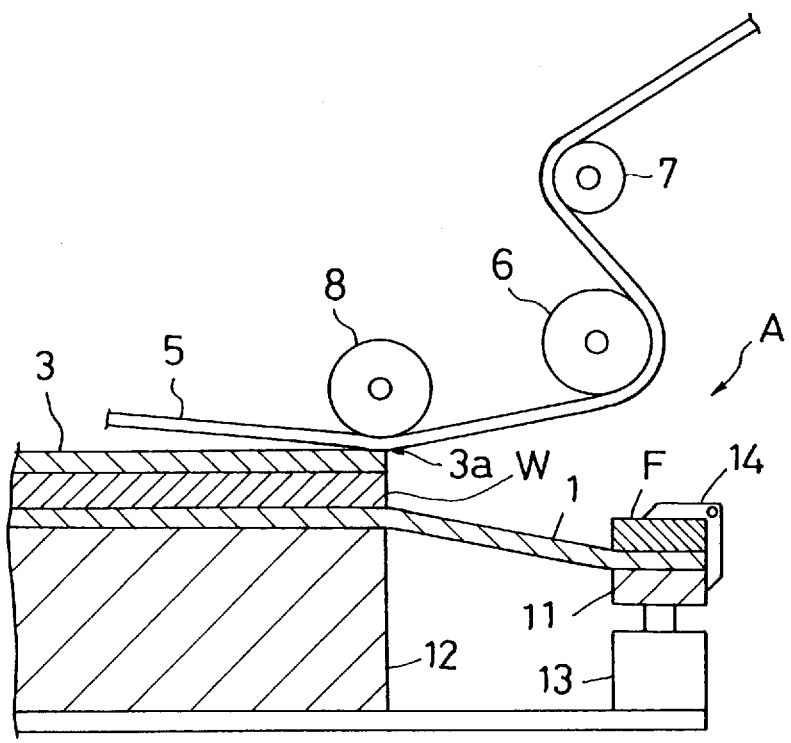
FIG. 11 is an enlarged explanatory view of a principal portion illustrating the method of peeling the protective adhesive tape.

FIG. 9 and FIG. 10 are explanatory view of a method of peeling a protective adhesive tape in a third embodiment of this invention, and FIG. 11 is an enlarged explanatory view of a principal portion illustrating the method of peeling the protective adhesive tape.

First, as shown in FIG. 9, work A is suction-supported on a suction table 2 as in the foregoing. This suction table 2 is composed of a frame chuck table 11 for supporting the frame F, and a wafer chuck table 12 for supporting the wafer W. The frame chuck table 11 is vertically movably supported by air cylinders 13.

Next, as shown in FIG. 10, dampers 14 arranged peripherally of the frame F first clamp the frame F to the frame chuck table 11 as a contact avoiding step. Then, the air cylinders 13 contract to lower the frame chuck table 11 to displace the frame F downward relative to the wafer W, whereby the supporting adhesive tape 1 is inclined downward toward the frame F. Subsequently, as shown in FIG. 11, the peeling tape 5 and protective adhesive tape 3 are peeled together from the surface of wafer W as in the foregoing first and second embodiments. Since, at this time, the frame F is displaced downward from the wafer W and the supporting adhesive tape 1 is inclined downward, the supporting adhesive tape 1 and peeling tape 5 have an enlarged contact avoiding region so that they do not stick to each other.

This embodiment may be implemented in the modified forms set out hereunder.

(1) In this embodiment, the frame F is clamped and displaced downward relative to the wafer W. The supporting adhesive tape 1 may be inclined toward the frame F by displacing the wafer chuck table 12 supporting the wafer W, upward relative to the frame F (2) The dampers 14 are arranged for clamping the frame F on the frame chuck table 11. This invention is not limited to this. The dampers 14 need not be provided if the frame chuck table 11 provides strong suction support.

Embodiments will be described hereinafter in which the apparatus employ the methods in the first to third embodiments described hereinbefore. In the drawings illustrating the embodiments described hereinafter, a peeling direction of rollers by tape peeling units is depicted opposite to what is shown in the drawings described above.

<Apparatus in the First Embodiment of This Invention>

Figure 12:
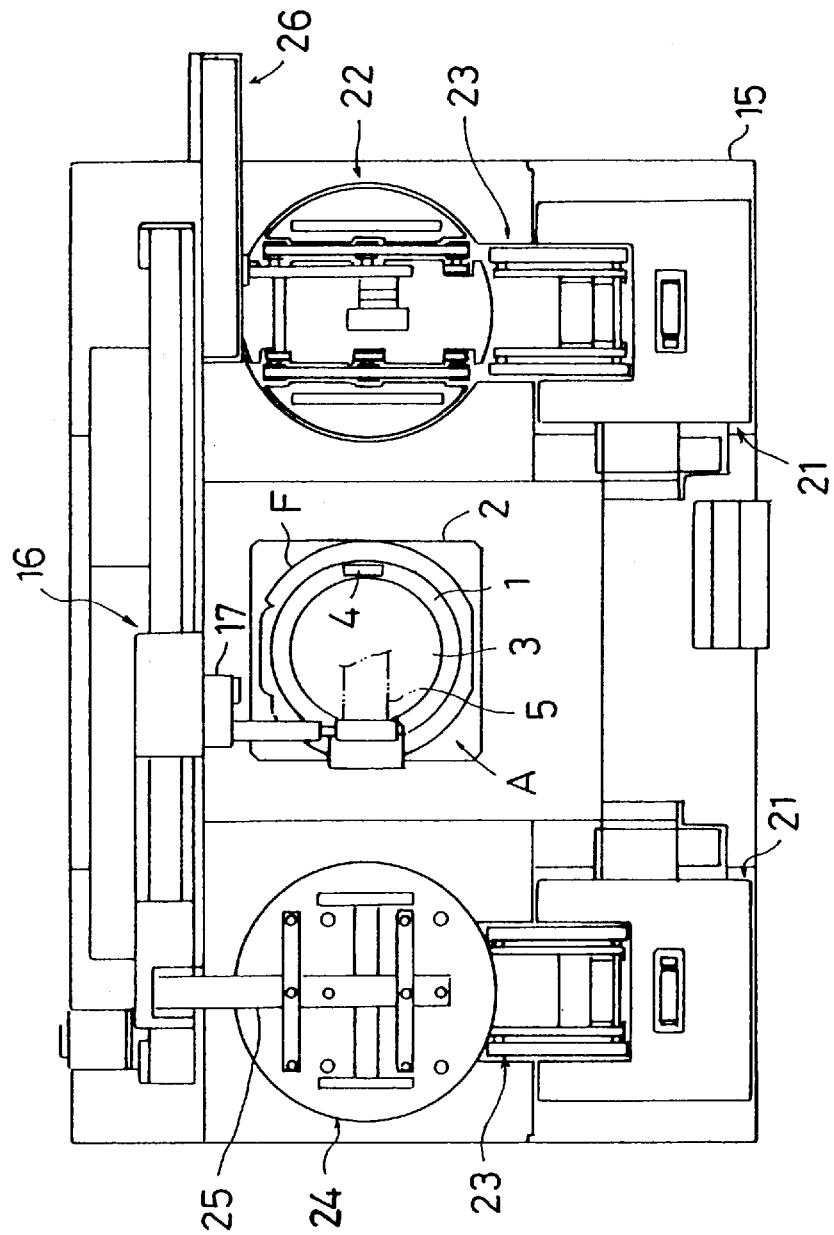
FIG. 12 is a plan view of a peeling apparatus in the first embodiment of this invention.

A peeling apparatus will be described in this embodiment which employs the peeling method described in the first embodiment. FIG. 12 is a plan view of the peeling apparatus in the first embodiment of this invention, and FIG. 13 is a front view of the apparatus in the first embodiment.

Figure 13:
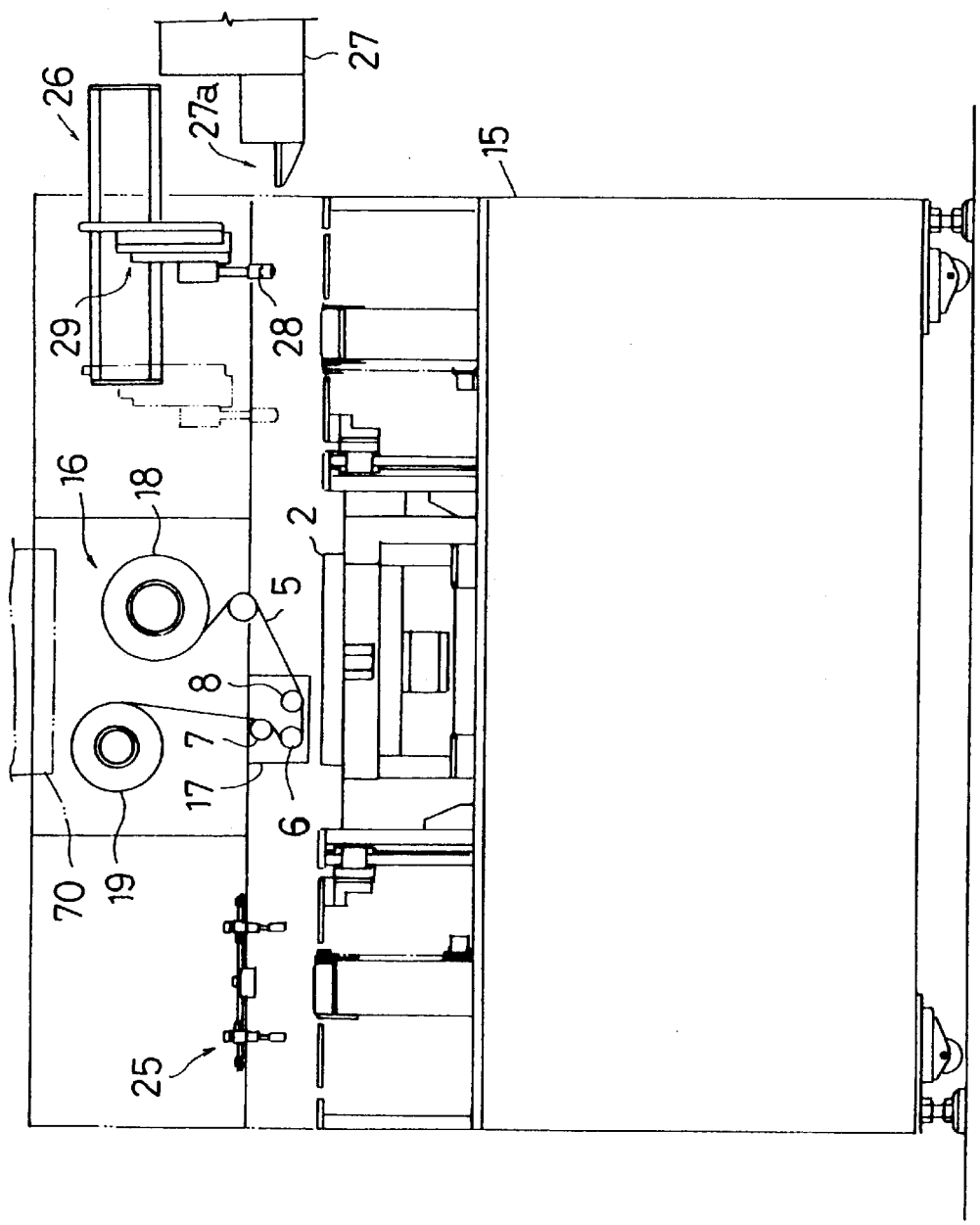
FIG. 13 is a front view of the apparatus in the first embodiment.

As shown in FIG. 12 and FIG. 13, a suction table 2 is fixed approximately centrally of a base 15 for suction-supporting work A, and a tape peeling unit 16 is disposed behind and above the suction table 2. The tape peeling unit 16 has an engaging member 17 meshed and engaged with a screw shaft and a rail arranged on a rear end portion of base 15 to be horizontally movable right and left, and supported thereon to lie above the peeling table 2, and said applying roller 8, draw roller 6 and pinch roller 7 around which peeling tape 5 drawn from a tape supply roller 18 is wound. Reference 19 denotes a tape collecting roller for taking up and collecting the peeling tape 5 having the protective adhesive tape 3 sticking thereto after a peeling process. The peeling tape 5 is pasted to the protective adhesive tape 3 by the applying roller 8, and the rollers 6–8 are moved horizontally over the work A, thereby peeling the peeling tape 5 and protective adhesive tape 3 together from the surface of wafer W.

Cassette receiving stands 21 are arranged forwardly of opposite sides of base 15, respectively, each for receiving a cassette storing works A stacked therein. The cassette placed on the right cassette receiving stand 21 stores, stacked therein, numerous works A before peeling processes, with wafers W having protective adhesive tape 3 applied to the surfaces thereof and supported in frames F by means of supporting adhesive tape 1. The cassette placed on the left cassette receiving stand 21 stores, stacked therein, works A after the peeling processes, with wafers W having the protective adhesive tape 3 peeled from the surfaces thereof.

A positioning section 22 is disposed rearwardly (upwardly in FIG. 12) of the right cassette receiving stand 21 for positioning the works A taken one by one out of the cassette to a predetermined posture. A belt transport section 23 is disposed to extend from the cassette receiving stand 21 to the positioning section 22. This cassette receiving stand 21 is constructed vertically movable by a lift mechanism not shown, for vertically moving the works A stacked in the cassette, stepwise to a predetermined height, whereby the belt transport section 23 successively transports the lowermost work A to the positioning section 22. In the positioning section 22, work A is positioned to the predetermined posture, with a V-notch formed in the frame F contacting and engaging a positioning pin. A storage preparing section 24 is disposed rearwardly of the left cassette receiving stand 21 (in a position opposed to the positioning section 22 across the suction table 2) for placement of work A after the process of peeling the protective adhesive tape 3, removed from the suction table 2 and before storage in the cassette. A belt transport section 23 similar to the above is disposed to extend between the storage preparing section 24 and cassette receiving stand 21.

Two suction transport sections 25 are disposed in rear regions of the apparatus, respectively, for sucking work A positioned by the positioning section 22 and transporting it to the suction table 2, and for sucking work A having undergone the process of peeling the protective adhesive tape 3 on the suction table 2 and transporting it to the storage preparing section 24 (though only the left suction transport section 25 is shown in FIG. 12).

Figure 14:
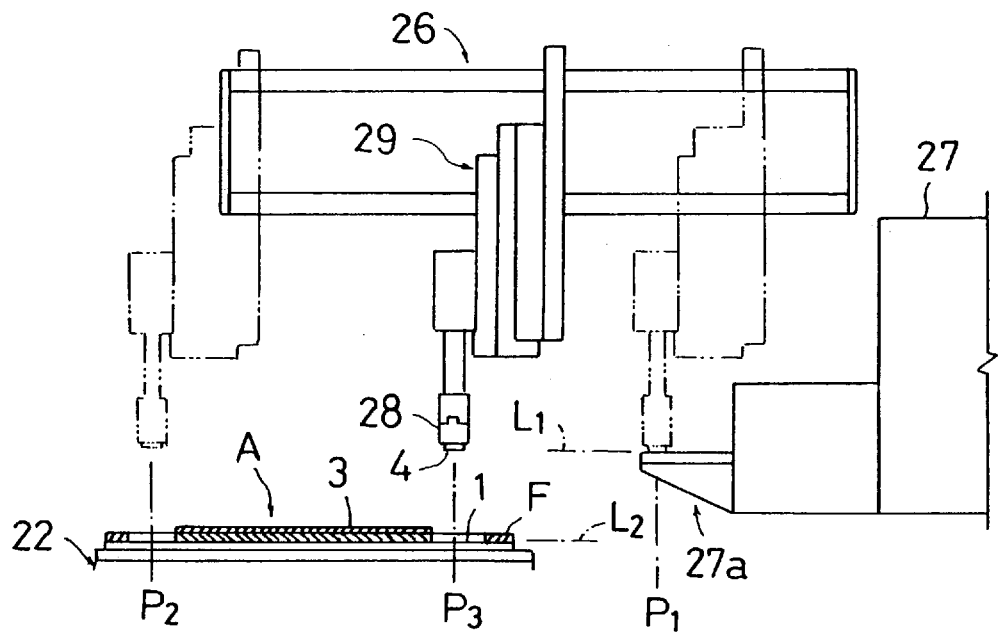
FIG. 14 is an enlarged front view of a thin plate applying section acting as contact avoiding means.
Figure 15:
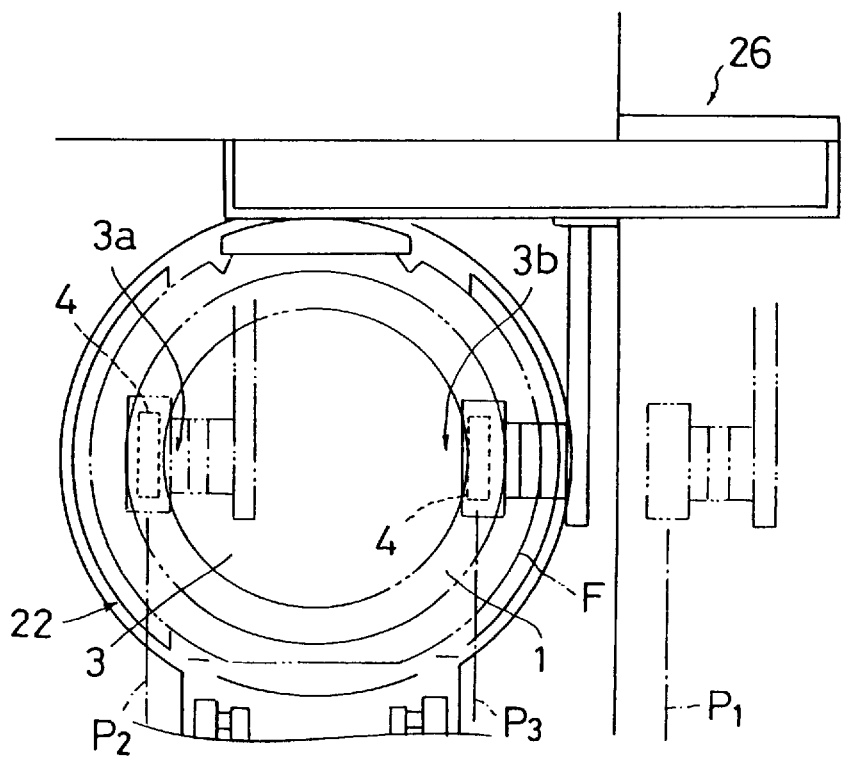
FIG. 15 is a plan view of the thin plate applying section.

FIG. 14 is an enlarged front view of a thin plate applying section, and FIG. 15 is an enlarged plan view of the thin plate applying section. As shown in FIG. 13 through FIG. 15, a thin plate applying section 26 acting as contact avoiding means which is a principal portion of this embodiment is disposed above the positioning section 22. This thin plate applying section 26 is constructed such that, a belt-like separator having thin plates 4 pasted thereto at predetermined intervals is transported horizontally in a case 27 attached outside the apparatus, to an outlet 27a of case 27, and the separator is transported around an acute-angled edge and back into the case 27 to be wound on and collected by a reel, whereby the thin plates 4 peel off the separator at the edge. Provided laterally of the case 27 are a suction pad 28 driven vertically between level L1 of said outlet 27a and a lower, application process level L2, for sucking the thin plates 4 peeled off at the edge, and a lift mechanism 29 for raising and lowering the same. Further, the lift mechanism 29 and suction pad 28 are constructed horizontally movable to a position P1 of outlet 27a, an applying position P2 above the supporting adhesive tape 1 adjacent the peel starting end 3a of protective adhesive tape 3, and an applying position P3 above the supporting adhesive tape 1 adjacent the peel finishing end 3b of protective adhesive tape 3.

This embodiment is constructed as described above. A processing operation of this peeling apparatus will be described briefly next.

First, the belt transport section 23 transports one work A among the numerous unprocessed works A stored in the cassette to the positioning section 22. The work A is positioned to the predetermined posture, with the V-notch of frame F engaging the positioning pin.

Next, the thin plate applying section 26 applies contact avoiding regions to the work A positioned. First, the suction pad 28 sucks a thin plate 4 in the position P1 of outlet 27a of case 27. Then, the suction pad 28 horizontally moves to the position P2 above the supporting adhesive tape 1 exposed between the peel starting end 3a of protective adhesive tape 3 applied to the surface of wafer W and the frame F present outwardly thereof, and lowers to apply the thin plate 4. The suction pad 28 moves horizontally again to the position P1 of outlet 27a to suck a next thin plate 4, thereafter moves horizontally to the position P3 above the supporting adhesive tape 1 adjacent the peel finishing end 3b of protective adhesive tape 3, and lowers to apply the thin plate 4.

Next, the suction transport section 25 transports the work A with the thin plates 4 applied to the supporting adhesive tape 1 to the suction table 2. As described hereinbefore (described in the first embodiment of the method of this invention), the applying roller 8 of tape peeling unit 16 first applies the peeling tape 5 to the peel starting end 3a of protective adhesive tape 3. Then, the peeling tape 5 and protective adhesive tape 3 are peeled together from the surface of wafer W by horizontally moving the respective rollers 6–8 over the work A. When the peeling tape 5 is applied to the peel starting end 3a of protective adhesive tape 3, the peeling tape 5 and supporting adhesive tape 1 never stick to each other since the thin plate 4 is already applied to the supporting adhesive tape 1, and the peeling operation progresses smoothly. The peeling process may be carried out reliably, without the peeling tape 5 and supporting adhesive tape 1 sticking to each other when the peeling process is completed since the thin plate 4 is applied also to the supporting adhesive tape 1 adjacent the peel finishing end 3b of protective adhesive tape 3.

The work A having undergone the peeling process is transported to the storage preparing section 24 by the suction transport section 25. The belt transport section 23 stores this work A in the cassette 20b. At the same time, work A to which a next thin plate 4 is applied is transported from the positioning section 22 to the suction table 2 to undergo a similar peeling process.

This embodiment may be implemented in the modified forms set out hereunder.

(1) The thin plate applying section 26 in the above embodiment has the suction pad 28 reciprocable twice between the position P1 of outlet 27a of case 27 and the two positions P2 and P3 above the support upper adhesive tape 1 adjacent the peel starting end 3a and peel finishing end 3b of protective adhesive tape 3. The suction pad 28 may be constructed to suck two thin plates 4 in the position P1 at the same time and move horizontally to the position P2 and position P3 in one reciprocation.

(2) The construction of thin plate applying section 26 is not limited to this embodiment, but other constructions may be employed.

<Apparatus in the Second Embodiment of This Invention>

Figure 16:
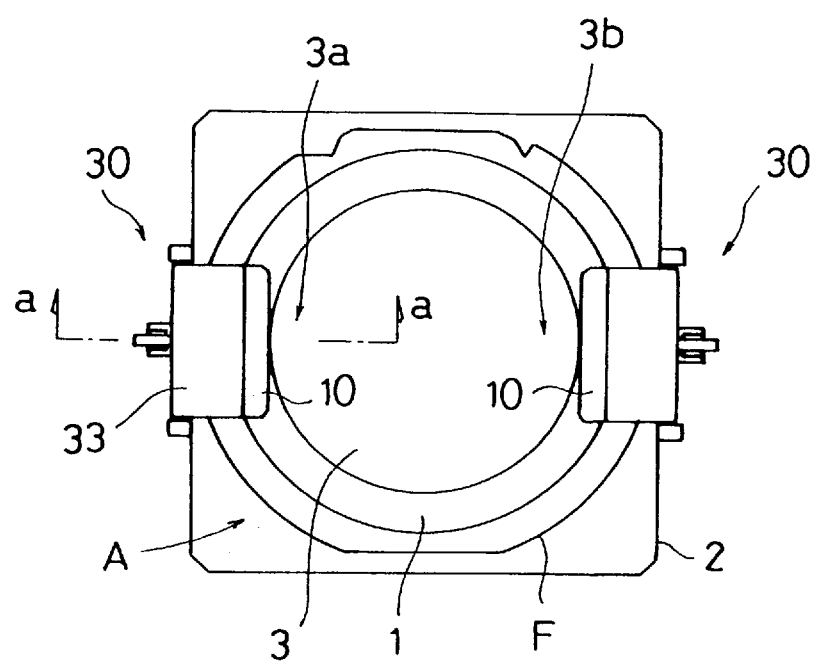
FIG. 16 is a plan view of a suction table part having plate spring advancing and retracting sections acting as contact avoiding means in a peeling apparatus in the second embodiment of this invention.
Figure 17:
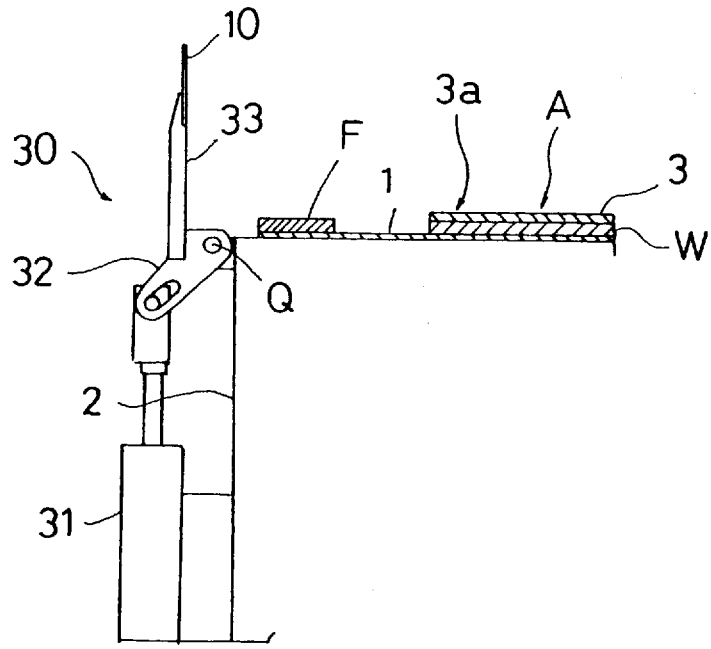
FIG. 17 is a view seen as indicated by arrows a—a of FIG. 16.
Figure 18:
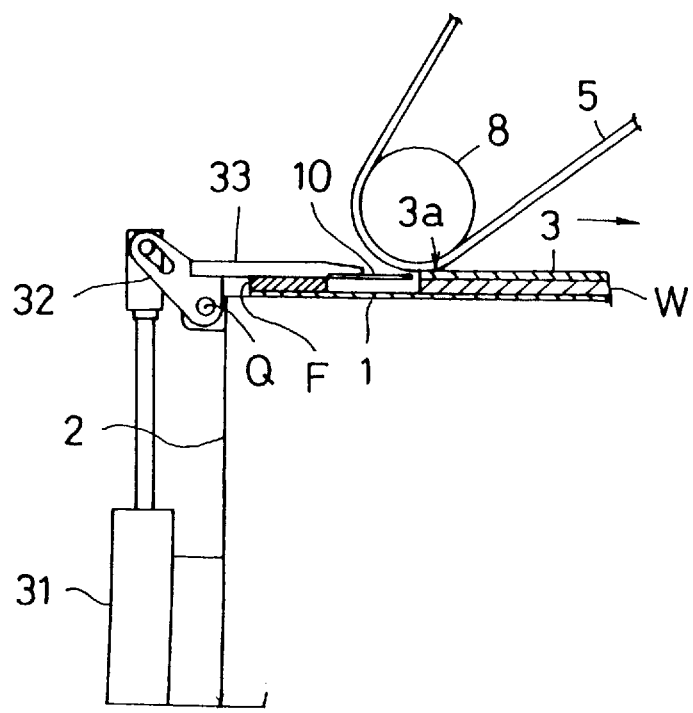
FIG. 18 is an explanatory view of the plate spring advancing and retracting section in operation.

A peeling apparatus will be described in this embodiment which employs the peeling method described in the second embodiment. This embodiment provides a modification of the thin plate applying section 26 acting as contact avoiding means described in the above first embodiment of apparatus of this invention. Other aspects of the apparatus construction are the same as those in the first embodiment, and therefore the aspects of the apparatus construction and operation other than the contact avoiding means will not be described. FIG. 16 is a plan view of a suction table part in the peeling apparatus in the second embodiment of this invention, and FIG. 17 and FIG. 18 are views seen as indicated by arrows a—a in FIG. 16.

The thin plate applying section 26 is now removed from the apparatus in the first embodiment shown in FIG. 12 and FIG. 13, and the peeling apparatus in this embodiment, as shown in FIG. 16, has plate spring advancing and retracting sections 30 arranged at right and left sides of suction table 2 to act as the contact avoiding means. As shown in FIG. 17, each plate spring advancing and retracting section 30 includes an air cylinder 31 disposed at a right or left side of the suction table 2, a swing member 32 pin-connected to a distal end of a rod of the air cylinder 31 to be oscillatable about an axis Q, and a support member 33 connected to the swing member 32 and supporting at a distal end thereof a plate spring 10 having non-adhesive opposite surfaces. With extension and contraction of air cylinder 31, the plate spring 10 is movable between a retracted position to which it is swung up as shown in FIG. 17 and a position above and adjacent the supporting adhesive tape 1 exposed between the peel starting end 3a and peel finishing end 3b of protective adhesive tape 3 and the frame F present outwardly thereof as shown in FIG. 18.

This embodiment is constructed as described above. A processing operation of this plate spring advancing and retracting section 30 will be described briefly next.

Work A positioned at the positioning section 22 is transported to the suction table 2 by the suction transport section 25. At this time, the air cylinder 31 of the plate spring advancing and retracting section 30 has been contracted, with the plate spring 10 swung up to the retracted position through the swing member 32 and support member 33. When the work A is suction-supported by the suction table 2, the air cylinder 31 is extended to swing the swing member 32 about the axis Q, whereby the support member 33 lies over the frame F, and the plate spring 10 is displaced to the position above and adjacent the supporting adhesive tape 1. Consequently, a region for avoiding contact with the peeling tape 5 is formed on the supporting adhesive tape 1 of work A.

Subsequently, as described in the apparatus in the first embodiment, the applying roller 8 of tape peeling unit 16 first applies the peeling tape 5 to the peel starting end 3a of protective adhesive tape 3. Then, the peeling tape 5 and protective adhesive tape 3 are peeled together from the surface of wafer W by horizontally moving the respective rollers 6–8 over the work A. As shown in FIG. 18, when the peeling tape 5 is applied to the peel starting end 3a of protective adhesive tape 3, the peeling tape 5 and supporting adhesive tape 1 never stick to each other since the supporting adhesive tape 1 is guarded by the plate spring 10 having the non-adhesive opposite surfaces and disposed adjacent and above the supporting adhesive tape 1. Even if the plate spring 10 is deformed by the descent and biasing of the applying roller 8 to contact the upper surface of supporting adhesive tape 1 right thereunder, the plate spring 10 oscillates and returns by elasticity to maintain a constant posture at all times. Further, the peeling tape 5 and supporting adhesive tape 1 never stick to each other also when the peeling process is competed since the plate spring 10 is disposed above the supporting adhesive tape 1 adjacent the peel finishing end 3b of protective adhesive tape 3.

When the operation to peel the protective adhesive tape 3 is completed, the air cylinder 31 is contracted again to move the plate spring 10 from the position adjacent and above the supporting adhesive tape 1 to the retracted position, and the work A is removed and transported from the suction table 2.

This embodiment may be implemented in the modified form set out hereunder.

(1) The plate spring advancing and retracting section 30 in this embodiment has the air cylinder 31 extendible and contractible to move the plate spring 10 between the retracted position and the position adjacent and above the supporting adhesive tape 1. For example, as described in the method in the second embodiment of this invention, the plate spring 10 may be supported at a distal end of a robot arm to be movable between the retracted position and the position adjacent and above the supporting adhesive tape 1. The construction in the above embodiment is not limitative.

<Apparatus in the Third Embodiment of This Invention>

Figure 19:
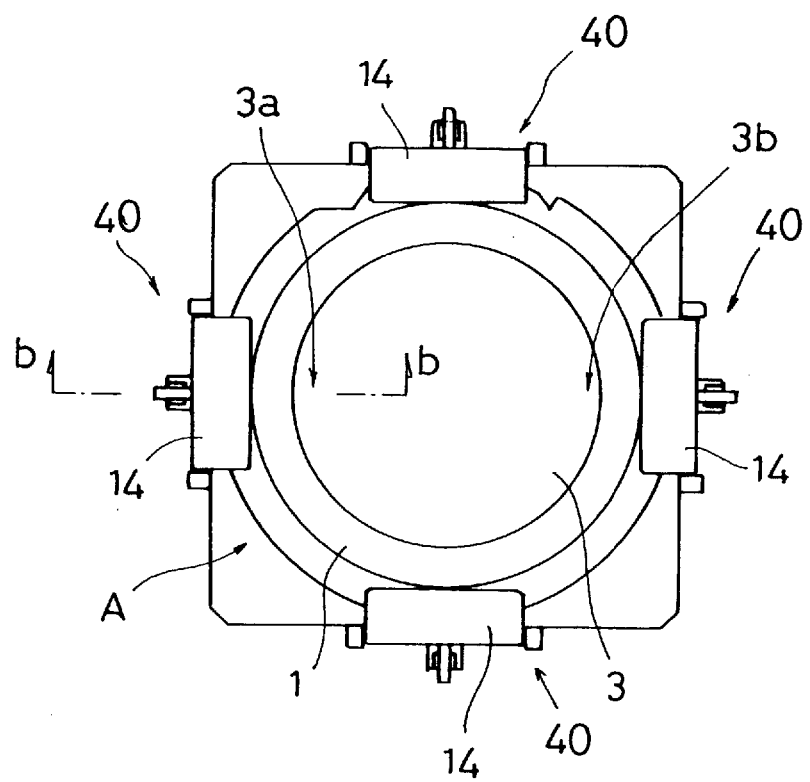
FIG. 19 is a plan view of a suction table part having frame raising and lowering sections acting as contact avoiding means in a peeling apparatus in the third embodiment of this invention.
Figure 20:
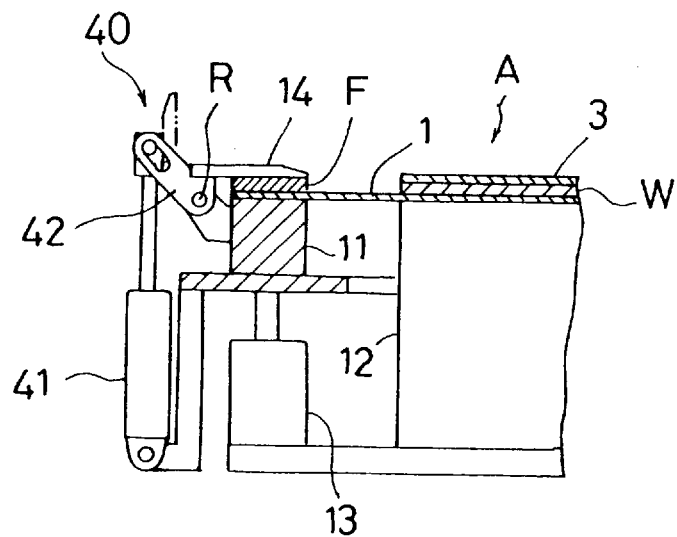
FIG. 20 is view seen as indicated by arrows b—b of FIG. 19.
Figure 21:
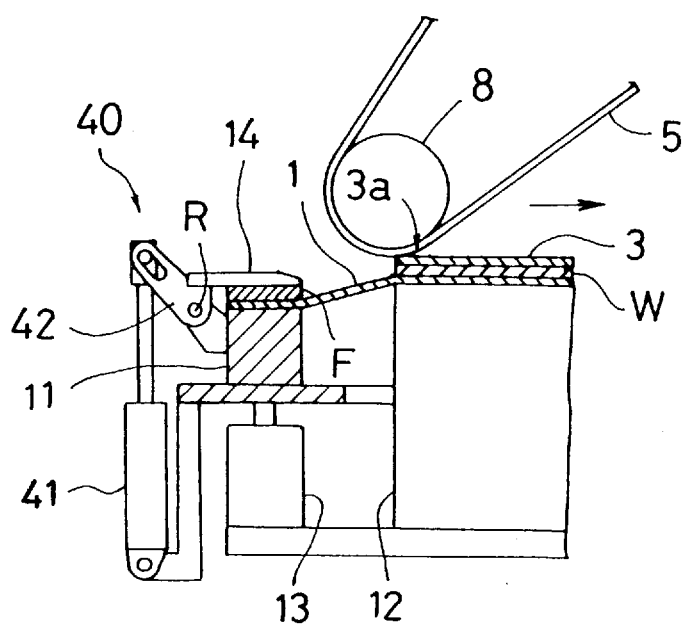
FIG. 21 is an explanatory view of the frame raising and lowering section in operation.

A peeling apparatus will be described in this embodiment which employs the peeling method described in the third embodiment. This embodiment provides a modification of the thin plate applying section 26 and plate spring advancing and retracting sections 30 acting as contact avoiding means described in the above first and second embodiments of apparatus of this invention. Other aspects of the apparatus construction are the same as those in the first embodiment, and therefore the aspects of the apparatus construction and operation other than the contact avoiding means will not be described. FIG. 19 is a plan view of a suction table part in the peeling apparatus in the third embodiment of this invention, and FIG. 20 and FIG. 21 are views seen as indicated by arrows b—b in FIG. 19.

The thin plate applying section 26 is now removed from the apparatus in the first embodiment shown in FIG. 12 and FIG. 13, and the peeling apparatus in this embodiment, as shown in FIG. 19, has frame raising and lowering sections 40 arranged in four positions around the suction table 2 to act as the contact avoiding means. As shown in FIG. 20, the frame raising and lowering sections 40 are constructed such that, the suction table 2 is divided into a wafer chuck table 12 for supporting the wafer W, and an annular frame chuck table 11 disposed concentrically therearound for supporting the frame F. The frame chuck table 11 is vertically movably supported by air cylinders 13. Clampers 14 are arranged equidistantly in four positions around the frame chuck table 11 and each pin-connected to a distal end of a rod of an air cylinder 41 for clamping the frame F to a swing member 42 oscillatable about an axis R. With extension and contraction of the air cylinder 41, the damper 14 is movable between a position to which it is swung up as shown in a two-dot-and-dash line in FIG. 20 and a clamping position shown in a solid line.

This embodiment is constructed as described above. A processing operation of this frame raising and lowering section 40 will be described briefly next.

Work A positioned at the positioning section 22 is transported to the suction table 2 by the suction transport section 25. At this time, the air cylinder 41 has been contracted, with the damper 14 swung up through the swing member 42 and the air cylinder 13 extended to raise the frame chuck table 11 to be level with the wafer chuck table 12. When the work A is suction-supported by the suction table 2, as shown in FIG. 20, the air cylinder 41 is first extended to swing the swing member 42 about the axis R, whereby the damper 14 clamps the frame F in one of the four positions thereof. Subsequently, as shown in FIG. 21, the air cylinder 13 is contracted to lower the frame chuck table 11, thereby displacing the frame F downward relative to the wafer W and inclining the supporting adhesive tape 1 between the wafer W and frame F downward toward the frame F. Consequently, a region is formed for avoiding contact between the supporting adhesive tape 1 and peeling tape 5.

Subsequently, as described in the apparatus in the first embodiment and the like, the applying roller 8 of tape peeling unit 16 first applies the peeling tape 5 to the peel starting end 3a of protective adhesive tape 3. Then, the peeling tape 5 and protective adhesive tape 3 are peeled together from the surface of wafer W by horizontally moving the respective rollers 6–8 over the work A. When the peeling tape 5 is applied to the peel starting end 3a of protective adhesive tape 3, the peeling tape 5 and supporting adhesive tape 1 never stick to each other since the frame F is displaced downward from the wafer W to incline the supporting adhesive tape 1 toward the frame F, thereby enlarging the contact avoiding region. Further, the peeling tape 5 and supporting adhesive tape 1 never stick to each other also when the peeling process is competed.

When the operation to peel the protective adhesive tape 3 is completed, the air cylinder 13 is extended to return to the original upper position, the air cylinder 41 is contracted again to cancel the clamping of the frame F, and the work A is removed and transported from the suction table 2.

This embodiment may be implemented in the modified forms set out hereunder.

(1) The frame raising and lowering sections 40 in this embodiment have the dampers 14 for clamping the frame F to the frame chuck table 11. The dampers 14 need not be provided if the frame chuck table 11 provides relatively strong suction support. The dampers 14 are arranged in four positions for clamping the frame F on the frame chuck upper table 11. This invention is not limited to this, but may comprise other constructions.

(2) The frame raising and lowering sections 40 in this embodiment displace the frame F downward relative to the wafer W by extending and contracting the air cylinders 13. The wafer chuck table 12 supporting the wafer W may be constructed vertically movable, whereby the supporting adhesive tape 1 is inclined toward the frame F by displacing the wafer W upward relative to the frame F.

<Apparatus in the Fourth Embodiment of This Invention>

Figure 22:
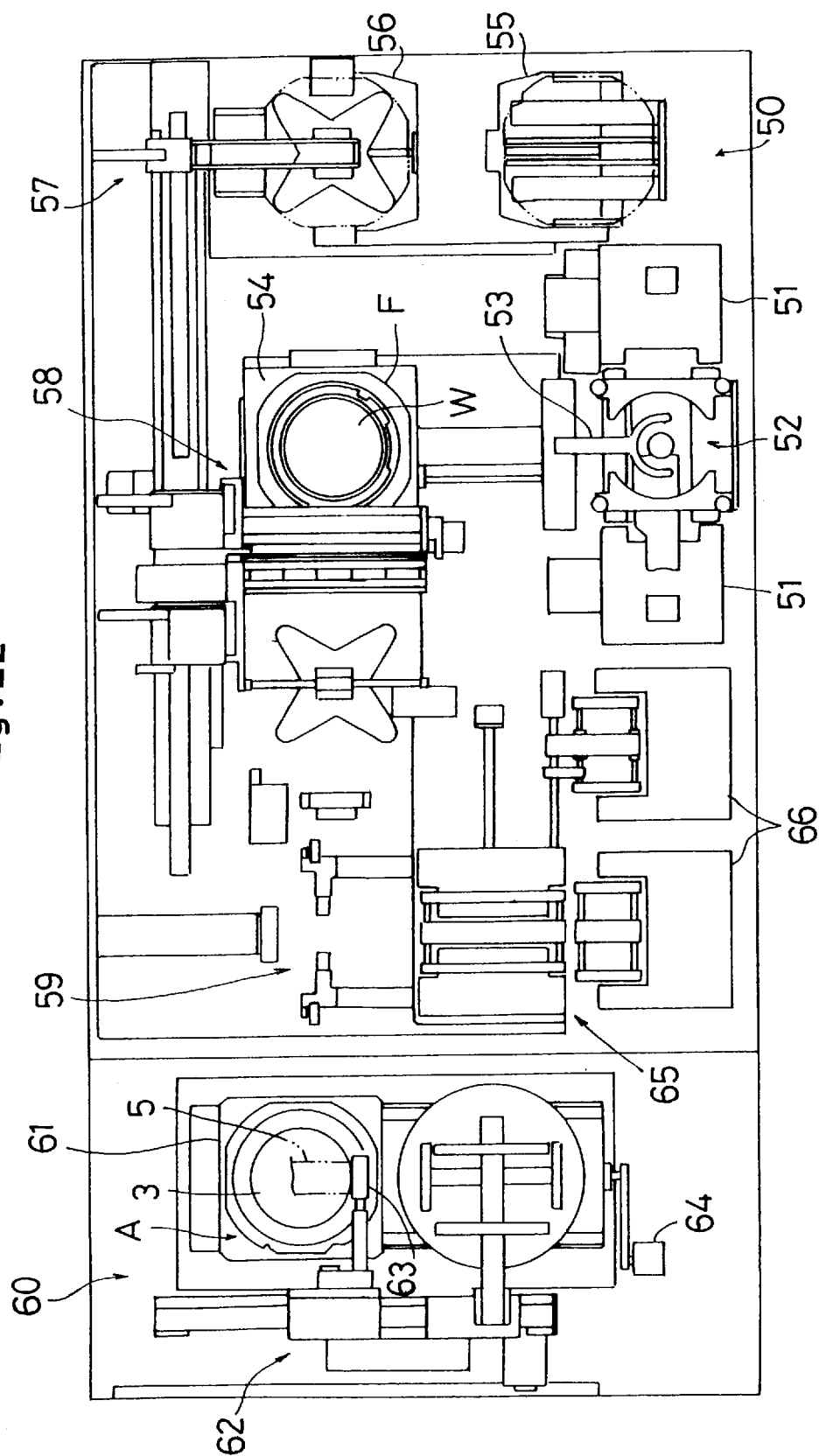
FIG. 22 is a schematic plan view of a peeling apparatus in a fourth embodiment of this invention.

One example of apparatus for peeling a protective adhesive tape of a wafer will be described in this embodiment with reference to FIG. 22, which includes a wafer mounting device 50 for supporting wafer W having the protective adhesive tape 3 applied to the surface thereof, in a frame F by means of a supporting adhesive tape 1. FIG. 22 is a schematic plan view of the peeling apparatus in the fourth embodiment.

Wafer cassettes (not shown) storing a plurality of wafers W are placed on two cassette receiving stands 51, respectively. A wafer W taken out of the wafer cassette, after being positioned to a predetermined state at a wafer positioning section 52, is reversed as suction-supported by a reversing fork 53 and placed on an applying table 54. The wafer on the applying table 54 has the reverse surface thereof facing up.

On the other hand, frames F are stacked on a frame stocker 55 of a frame loading mechanism, and lower frames F are successively pushed out. A frame F pushed out is pressed against two positioning pins arranged on a positioning table 56, and frame F is positioned with the V-notch of frame F engaging a positioning pin. The frame F positioned is suction-supported, transported to the applying table 54, and placed on the applying table 54, with the center thereof approximately registering with the center of wafer W on the applying table 54, by a frame transport mechanism 57.

After the wafer W and frame F are placed on the applying table 54 in this way, an applying mechanism 58 applies the support adhesive tape to the frame F and wafer W. Then, a tape cutting mechanism (not shown) cuts out the support adhesive tape 1 on the frame. When the support adhesive tape is cut out, a residual tape peeling mechanism (not shown) peels and collects residual tape adhering to peripheries of frame F.

Work A on the applying table 54 obtained in this way is transported to a swing reversing unit 59, and swung 180 degrees in a horizontal direction and reversed in the vertical direction so that the surface of the wafer faces upward, by this swing reversing unit 59, and thereafter placed on a suction table 61 of a peel processing section 60 by a suction transport mechanism not shown.

This suction table 61 is constructed to be horizontally movable, and a tape peeling unit 62 is fixed to the left of suction table 61. When the work is suction-supported by the suction table 61, an applying roller 63 of the tape peeling unit 62 is lowered to a peel starting end of the protective adhesive tape 3 applied to the surface of wafer W to press and apply the peeling tape 5 to the protective adhesive tape 3. Next, a motor 64 is driven to move the suction table 61 horizontally, downward in FIG. 22, thereby peeling the peeling tape 5 and protective adhesive tape 3 together from the surface of wafer W. Though not shown in the drawings, this peeling apparatus also has either one of the thin plate applying section 26, plate spring advancing and retracting sections 30 and frame raising and lowering sections 40 shown in the first to third embodiments, to act as the contact avoiding means. There occurs no inconvenience of the peeling tape 5 and support adhesive tape 1 sticking to each other since regions are provided for avoiding contact with the peeling tape 5, on the supporting adhesive tape 1 exposed between the peel starting end and peel finishing end of protective adhesive tape 3 and the frame F present outwardly thereof.

The work A placed on the suction table 61 having moved horizontally, with the protective adhesive tape 3 peeled from the surface of wafer W, is transported to a transport table 65 by a suction transport mechanism not shown. Thereafter the work A is transported by the transport table 65, and stored in a frame cassette (not shown) placed on a frame cassette receiving stand 66.

Figure 23:
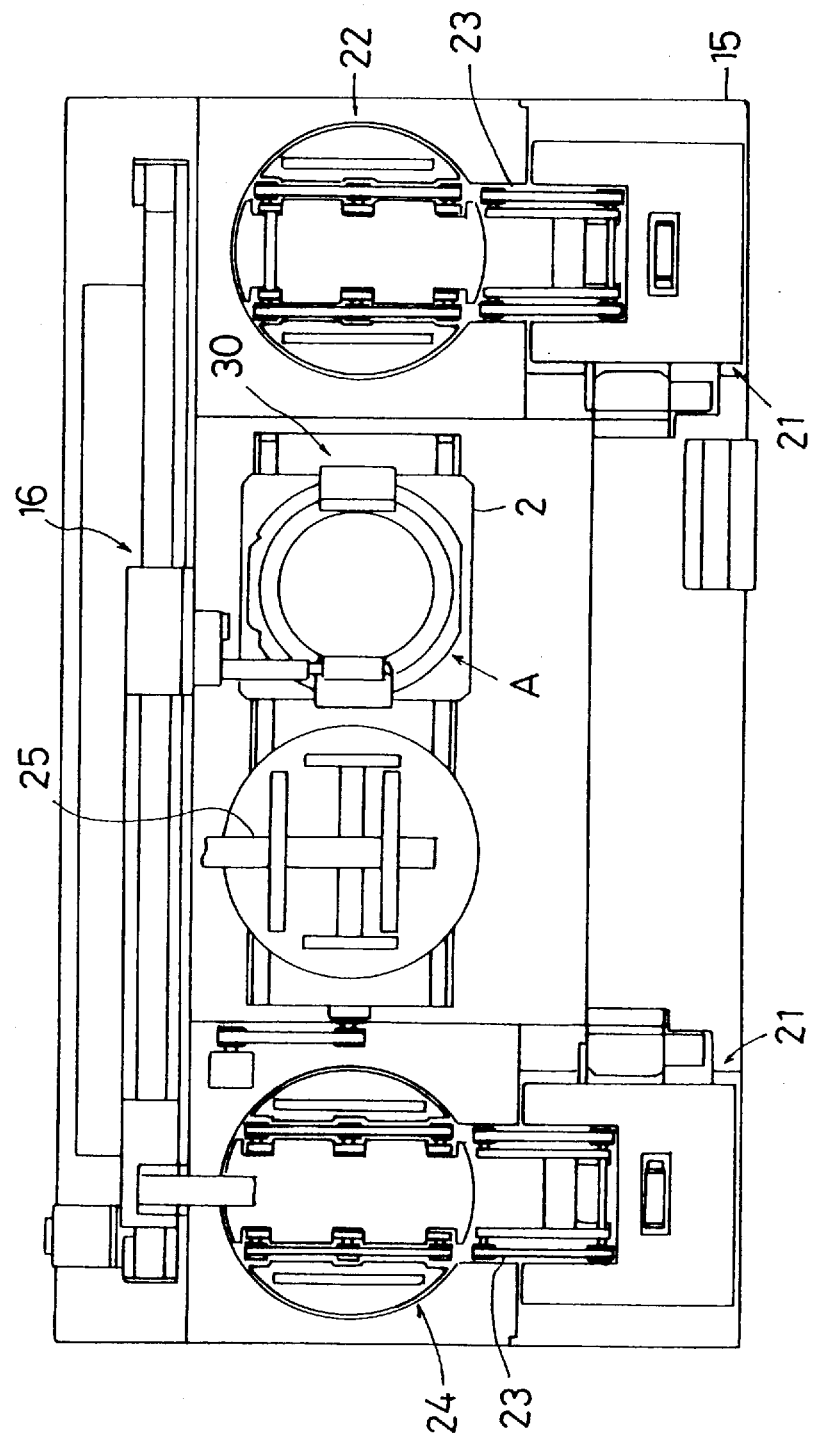
FIG. 23 is a plan view of a modified peeling apparatus.
Figure 24:
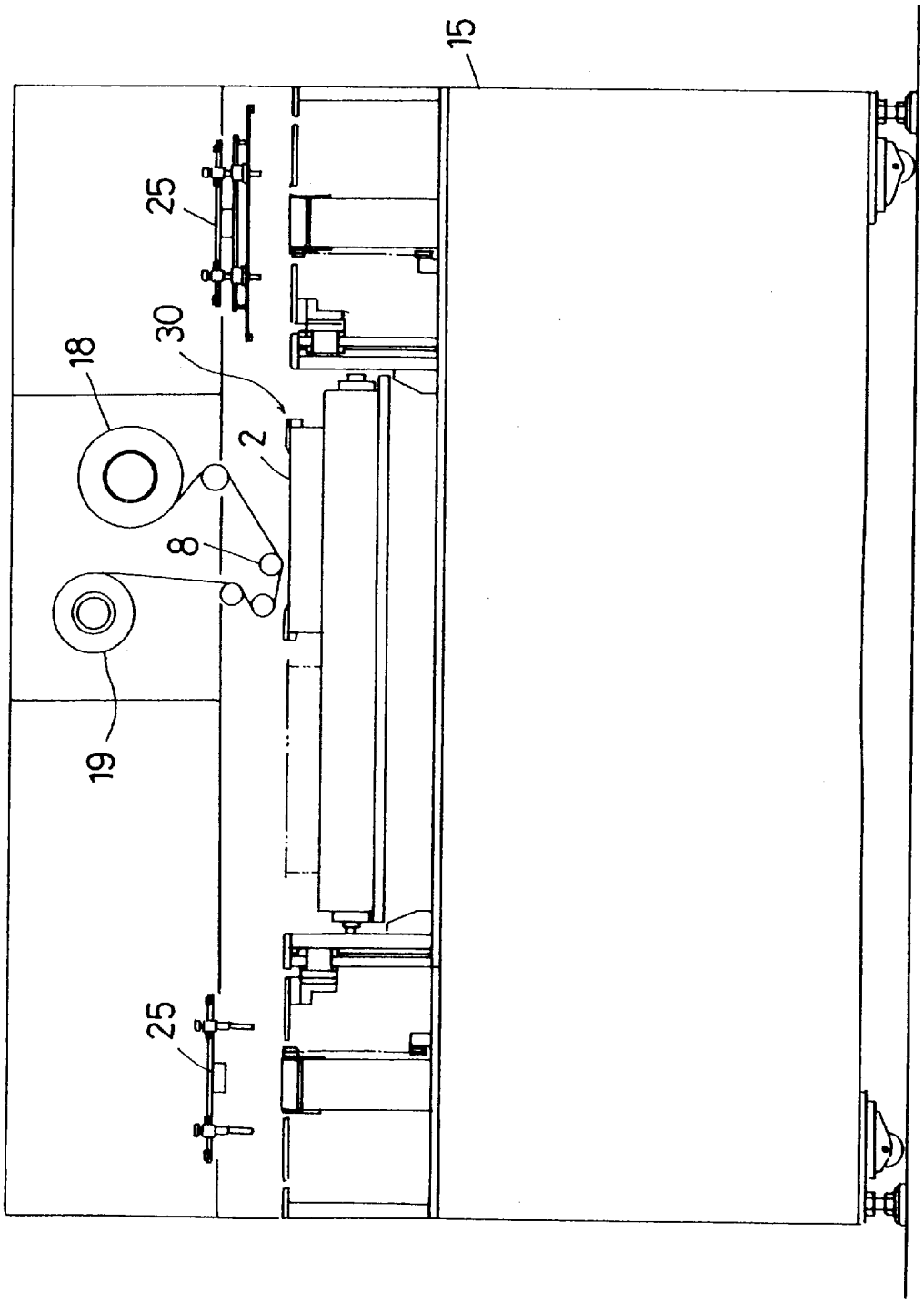
FIG. 24 is a front view of the modified peeling apparatus.
Figure 25:
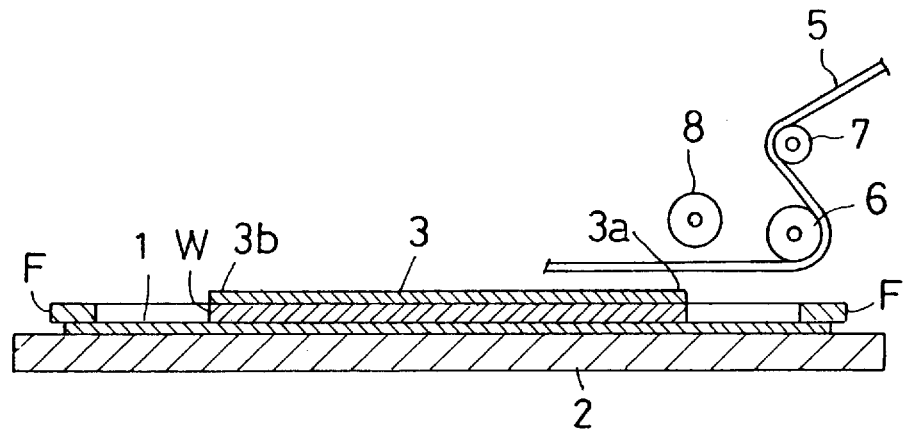
FIG. 25 is an explanatory view of a conventional method of peeling protective adhesive tape.
Figure 26:
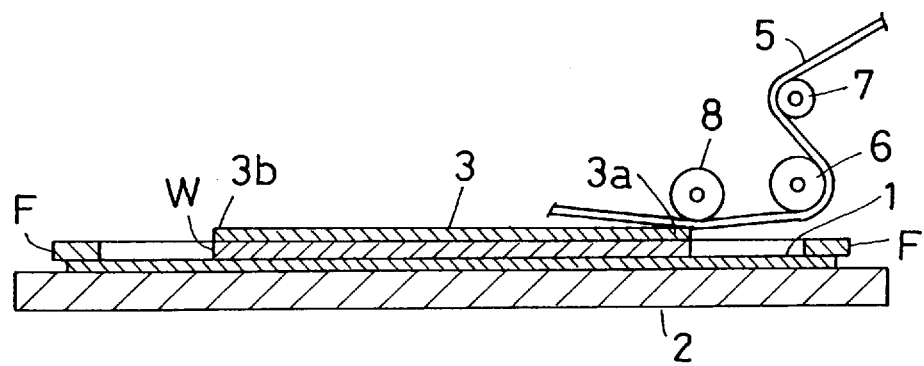
FIG. 26 is an explanatory view of the conventional method of peeling protective adhesive tape.
Figure 27:
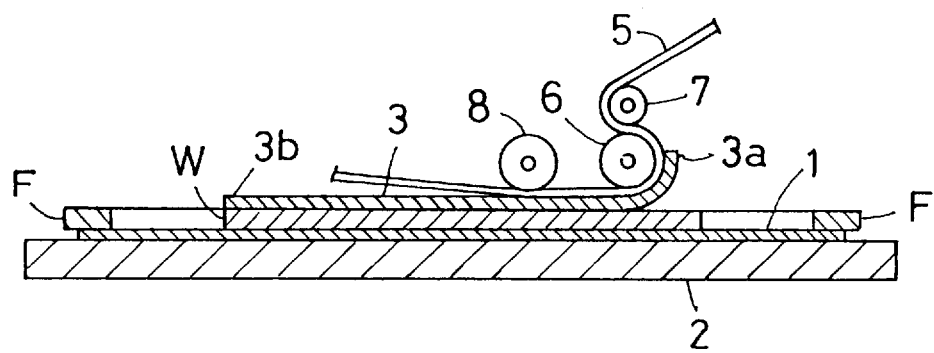
FIG. 27 is an explanatory view of the conventional method of peeling protective adhesive tape.
Figure 28:
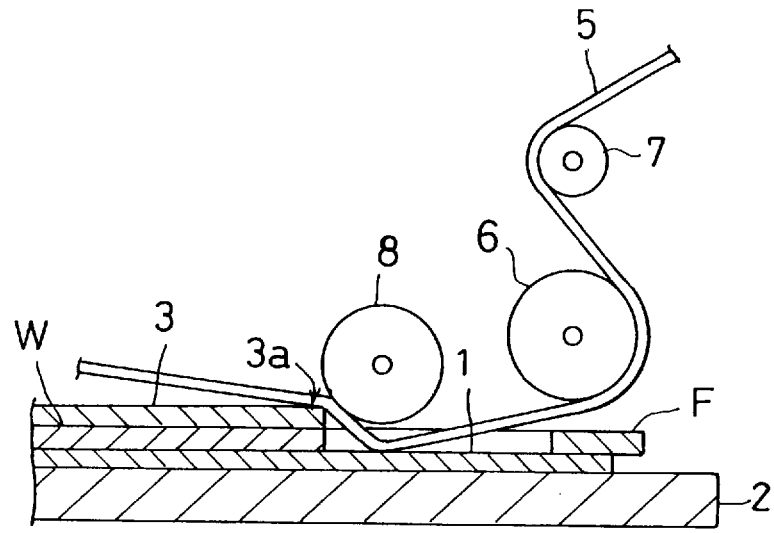
FIG. 28 is an enlarged explanatory view of the conventional method of peeling protective adhesive tape.
Figure 29:
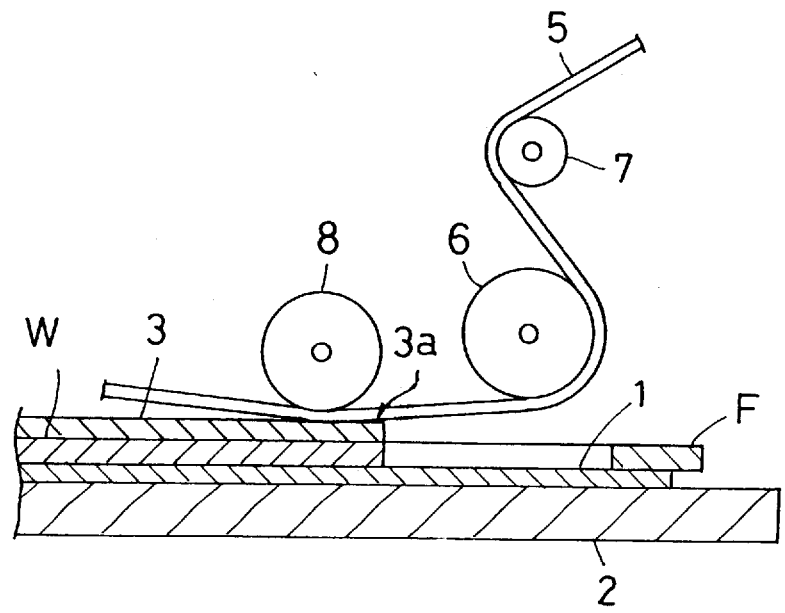
FIG. 29 is an enlarged explanatory view of the conventional method of peeling protective adhesive tape.

The foregoing apparatus in the first to fourth embodiments may be implemented in the modified forms set out hereunder. FIG. 23 is a plan view of a modified peeling apparatus, and FIG. 24 is a front view of the apparatus shown in FIG. 23.

(1) In the first to third embodiments described hereinbefore, the peeling apparatus is exemplified where the suction table 2 for supporting work A is fixed to a central portion of the apparatus, and the tape peeling unit 16 is movable horizontally over the suction table 2. This invention is not limited to this. As shown in the fourth embodiment and in FIG. 23 and FIG. 24, for example, the peeling apparatus may be constructed such that the tape peeling unit 16 is fixed and the suction table 2 is horizontally movable.

(2) In each of the foregoing embodiments of apparatus, an ultraviolet curable adhesive tape may be used as the protective adhesive tape 3 to be applied to the surface of wafer W, and an ultraviolet irradiating device may be disposed in a position shown in a two-dot-and-dash line in FIG. 13, for example to irradiate the ultraviolet curable protective adhesive tape 3 with ultraviolet rays to cure the adhesive on the protective adhesive tape 3, thereby to weaken the adhesion to the surface of wafer W, before the tape peeling unit 16 peels the protective adhesive tape 3 of wafer W. Subsequently, the protective adhesive tape 3 may easily be peeled by peeling the peeling tape 5 and protective adhesive tape 3 together from the surface of wafer W with the tape peeling unit 16.

INDUSTRIAL UTILITY

As described above, the method and apparatus for peeling a protective adhesive tape of a semiconductor wafer according to this invention apply a region for avoiding contact between a supporting adhesive tape adjacent a peel starting end of a protective adhesive tape and a peeling tape wound around rollers when peeling the protective adhesive tape from work having the protective adhesive tape applied to the surface of the semiconductor wafer supported in a ring-shaped frame by means of the supporting adhesive tape, and are therefore suited for peeling the protective adhesive tape from the surfaces of semiconductor wafers having undergone back grinding treatment in a semiconductor wafer manufacturing process.

We claim:

1. A method of peeling a protective adhesive tape from work having the protective adhesive tape applied to a surface of a semiconductor wafer supported in a ring-shaped frame by means of a supporting adhesive tape, said method of peeling the protective adhesive tape of the semiconductor wafer being characterized by a contact avoiding step for providing a region for avoiding contact between the supporting adhesive tape at least adjacent a peel starting end of the protective adhesive tape and a peeling tape wound around rollers when applying the peeling tape to the protective adhesive tape with the rollers and horizontally moving the work and the rollers relative to each other to peel the peeling tape and the protective adhesive tape together from the surface of the semiconductor wafer.

2. A method of peeling the protective adhesive tape of the semiconductor wafer as defined in claim 1, wherein said contact avoiding step comprises a step of applying a thin plate member with a non-adhesive upper surface to the supporting adhesive tape.

3. A method of peeling the protective adhesive tape of the semiconductor wafer as defined in claim 1, wherein said contact avoiding step comprises a step of displacing an elastic member with non-adhesive opposite surfaces from a retracted position to a position adjacent and above said supporting adhesive tape.

4. A method of peeling the protective adhesive tape of the semiconductor wafer as defined in claim 1, wherein said contact avoiding step comprises a step of inclining the supporting adhesive tape downward toward the frame by displacing the ring-shaped frame and the semiconductor wafer vertically relative to each other.

5. A method of peeling the protective adhesive tape of the semiconductor wafer as defined in claim 1, wherein said contact avoiding step comprises a step of applying a thin plate member with a non-adhesive upper surface to the supporting adhesive tape, and a step of inclining the supporting adhesive tape downward toward the frame by displacing the ring-shaped frame and the semiconductor wafer vertically relative to each other.

6. A method of peeling the protective adhesive tape of the semiconductor wafer as defined in claim 1, wherein said contact avoiding step comprises a step of displacing an elastic member with non-adhesive opposite surfaces from a retracted position to a position adjacent and above said supporting adhesive tape, and a step of inclining the supporting adhesive tape downward toward the frame by displacing the ring-shaped frame and the semiconductor wafer vertically relative to each other.

7. A method of peeling the protective adhesive tape of the semiconductor wafer as defined in any one of claims 1 to 6, wherein said protective adhesive tape is an ultraviolet curable adhesive tape, and said method of peeling the protective adhesive tape of the semiconductor wafer comprising a step of irradiating the protective adhesive tape with ultraviolet rays before peeling the protective adhesive tape of the semiconductor wafer.

8. An apparatus for peeling a protective adhesive tape from work having the protective adhesive tape applied to a surface of a semiconductor wafer supported in a ring-shaped frame by means of a supporting adhesive tape, said apparatus for peeling the protective adhesive tape of the semiconductor wafer being characterized by comprising tape peeling means for applying the peeling tape to the protective adhesive tape with rollers and horizontally moving the work and the rollers relative to each other to peel the peeling tape and the protective adhesive tape together from the surface of the semiconductor wafer, and contact avoiding means for providing a region for avoiding contact between the supporting adhesive tape at least adjacent a peel starting end of the protective adhesive tape and the peeling tape wound around the rollers.

9. An apparatus for peeling the protective adhesive tape of the semiconductor wafer as defined in claim 8, wherein said contact avoiding means comprises means for applying a thin plate member with a non-adhesive upper surface to the supporting adhesive tape.

10. An apparatus for peeling the protective adhesive tape of the semiconductor wafer as defined in claim 8, wherein said contact avoiding means comprises means for displacing an elastic member with non-adhesive opposite surfaces from a retracted position to a position adjacent and above said supporting adhesive tape.

11. An apparatus for peeling the protective adhesive tape of the semiconductor wafer as defined in claim 8, wherein said contact avoiding means comprises means for inclining the supporting adhesive tape downward toward the frame by displacing the ring-shaped frame and the semiconductor wafer vertically relative to each other.

12. An apparatus for peeling the protective adhesive tape of the semiconductor wafer as defined in claim 8, wherein said contact avoiding means comprises means for applying a thin plate member with a non-adhesive upper surface to the supporting adhesive tape, and means for inclining the supporting adhesive tape downward toward the frame by displacing the ring-shaped frame and the semiconductor wafer vertically relative to each other.

13. An apparatus for peeling the protective adhesive tape of the semiconductor wafer as defined in claim 8, wherein said contact avoiding means comprises means for displacing an elastic member with non-adhesive opposite surfaces from a retracted position to a position adjacent and above said supporting adhesive tape, and means for inclining the supporting adhesive tape downward toward the frame by displacing the ring-shaped frame and the semiconductor wafer vertically relative to each other.

14. An apparatus for peeling the protective adhesive tape of the semiconductor wafer as defined in any one of claims 8 to 13, wherein said protective adhesive tape is an ultraviolet curable adhesive tape, said apparatus for peeling the protective adhesive tape of the semiconductor wafer comprising ultraviolet irradiating means for irradiating the protective adhesive tape with ultraviolet rays before peeling the protective adhesive tape of the semiconductor wafer.

15. An apparatus for peeling the protective adhesive tape of the semiconductor wafer as defined in any one of claims 8 to 13, wherein said peeling apparatus includes a wafer mounting device for supporting the semiconductor wafer having the protective adhesive tape applied to the surface thereof, in the ring-shaped frame by means of the supporting adhesive tape.

* * * * *